United States Patent
Cheng et al.

(10) Patent No.: US 10,181,823 B1
(45) Date of Patent: Jan. 15, 2019

(54) INTEGRATED ULTRA-COMPACT VSWR INSENSITIVE COUPLER

(71) Applicant: pSemi Corporation, San Diego, CA (US)

(72) Inventors: Chih-Chieh Cheng, Poway, CA (US); Tero Tapio Ranta, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 15/652,079

(22) Filed: Jul. 17, 2017

(51) Int. Cl.
*H03F 3/191* (2006.01)
*H03F 1/30* (2006.01)
*H03F 3/195* (2006.01)
*H03F 3/213* (2006.01)
*H03F 1/56* (2006.01)

(52) U.S. Cl.
CPC .............. *H03F 1/30* (2013.01); *H03F 1/56* (2013.01); *H03F 3/195* (2013.01); *H03F 3/213* (2013.01); *H03F 1/565* (2013.01); *H03F 3/191* (2013.01); *H03F 2200/222* (2013.01); *H03F 2200/318* (2013.01); *H03F 2200/387* (2013.01); *H03F 2200/451* (2013.01); *H03F 2200/465* (2013.01)

(58) Field of Classification Search
CPC ... H03F 1/30; H03F 1/56; H03F 3/195; H03F 3/213; H03F 3/191; H03F 2200/222; H03F 2200/318; H03F 1/565; H03H 7/38; H03H 1/048; H01L 2924/3011; H04B 1/0458
USPC ........................................................ 330/302
See application file for complete search history.

(56) References Cited

U.S. PATENT DOCUMENTS

| | | |
|---|---|---|
| 6,667,506 B1 | 12/2003 | Reedy et al. |
| 7,042,309 B2 | 5/2006 | Podell |
| 7,339,366 B2 | 3/2008 | Li |
| 8,502,620 B2 | 8/2013 | Lu et al. |
| 8,798,561 B2 | 8/2014 | Acimovic |
| 9,024,700 B2 | 5/2015 | Ranta |
| 9,197,194 B2 | 11/2015 | Reedy et al. |

(Continued)

OTHER PUBLICATIONS

Rederick, Norman L., "Compact Low Loss Signal Coupler", patent application filed in the USPTO on May 12, 2017, U.S. Appl. No. 15/594,336, 30 pgs.

(Continued)

*Primary Examiner* — Khanh V Nguyen
(74) *Attorney, Agent, or Firm* — Jaquez Land Greenhaus LLP; Martin J. Jaquez, Esq.; John Land, Esq.

(57) ABSTRACT

A ultra-compact coupler designed to sample the actual output power of a power amplifier and which is "VSWR insensitive", such that reflected power is essentially not coupled to a detector circuit and only forward power is detected and processed. In a first embodiment, a coupler is situated between the final amplifier stage of a power amplifier and an output impedance matching network, and is specially configured for operation in a low impedance environment in conjunction with a detector circuit, thereby substantially reducing the areal size of the coupler. In a second embodiment, a coupler is integrated within an output impedance matching network coupled to the final amplifier stage of a power amplifier so as to share an inductor between the coupler and the output impedance matching network, thereby further substantially reducing the areal size of the coupler.

14 Claims, 10 Drawing Sheets

(56) References Cited

U.S. PATENT DOCUMENTS

| | | | |
|---|---|---|---|
| 9,553,617 B2* | 1/2017 | Srirattana | H04B 1/40 |
| 9,716,306 B2 | 7/2017 | Kuroda | |
| 9,905,901 B1 | 2/2018 | Lyu et al. | |
| 2007/0103253 A1 | 5/2007 | Napijalo | |
| 2009/0096531 A1 | 4/2009 | Shimamoto et al. | |
| 2013/0324057 A1* | 12/2013 | Zhang | H04B 1/40 |
| | | | 455/77 |
| 2014/0111156 A1* | 4/2014 | Lee | H02J 5/005 |
| | | | 307/104 |
| 2015/0042412 A1* | 2/2015 | Imbornone | H01P 5/18 |
| | | | 333/112 |
| 2016/0028146 A1 | 1/2016 | Zhang et al. | |

OTHER PUBLICATIONS

Takaoka, Dean O., Office Action received from the USPTO dated Jun. 29, 2018 for U.S. Appl. No. 15/594,336, 47 pgs.

Takaoka, Dean O., Notice of Allowance received from the USPTO dated Oct. 19, 2018 for U.S. Appl. No. 15/594,336, 12 pgs.

* cited by examiner

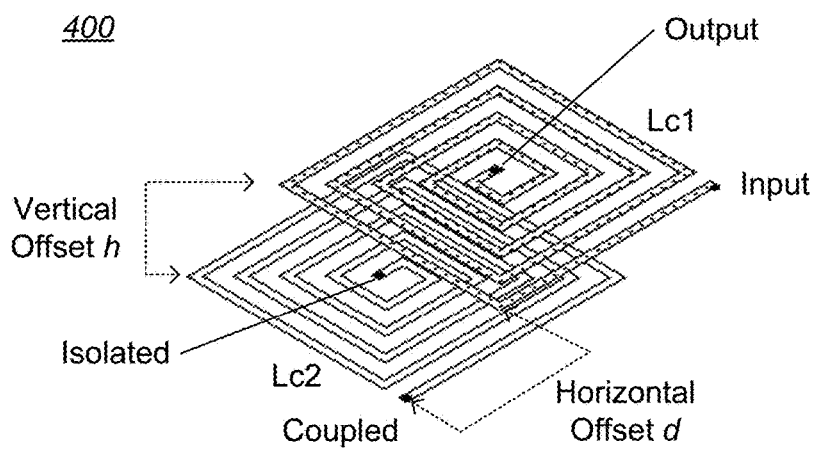
FIG. 4A
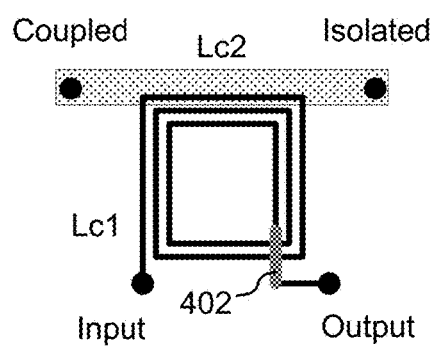 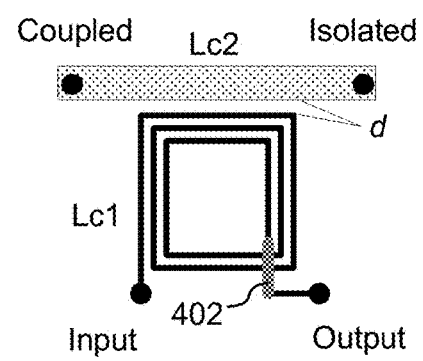
FIG. 4B    FIG. 4C

*1000*

1002 — For coupling to a final amplifier stage having a first output impedance and providing radio frequency forward power, providing an output IMN having an IMN input, an IMN output, & a first inductor coupled between the IMN input & the IMN output, for matching the first output impedance to a second output impedance

1004 — Providing a coupler that provides a portion of the provided forward power, as coupled forward power, to a selected port, the coupler having an input port, an output port, a coupled port, and an isolated port

1006 — Electrically connecting the input port to the IMN input, electrically connecting the output port to the IMN output, coupling the output port to the input port through a coupling segment of the first inductor, electrically connecting the coupled port to a second inductor, capacitively & inductively coupling the coupled port to the input port through interaction of the second inductor with the coupling segment of the first inductor, wherein the coupled port is the selected port, electrically connecting the isolated port to the coupled port by the second inductor, & capacitively and inductively coupling the isolated port to the output port through interaction of the second inductor with the coupling segment of the first inductor, wherein the first & second inductor are sized to have reactance values ranging from ~0 ohms to ~100 ohms

1008 — Electrically connecting a first terminating resistance to the isolated port, and electrically connecting a second terminating resistance to the coupled port

FIG. 10

INTEGRATED ULTRA-COMPACT VSWR INSENSITIVE COUPLER

CROSS-REFERENCE TO RELATED APPLICATIONS

This invention may be related to U.S. patent application Ser. No. 15/594,336, filed May 12, 2017, entitled "Compact Low Loss Signal Coupler", assigned to the assignee of the present invention and hereby incorporated by reference.

BACKGROUND

(1) Technical Field

This invention relates to electronic circuits, and more particularly to coupler circuits.

(2) Background

Power amplifiers (PAs) are used in a multitude of electronic systems, particularly radio frequency (RF) systems such as radios, cellular telephones, WiFi, etc. FIG. 1 is a block diagram of a prior art radio transmitter two-stage power amplifier 100. In the illustrated example, an integrated circuit (IC) 102 includes several subcircuits that accept an RF input signal RFIN and generate an amplified output signal RFOUT to a selected destination (e.g., one or more band filters, RF signal switches, and/or antennas); the IC 102 may also be referred to as a "chip" or "die".

In the illustrated example, an input impedance matching network (IMN) 104 impedance matches the input signal RFIN to a first power amplifier stage (often called a driver) 106. An interstage IMN 108 couples and matches the output of the driver 106 to the input of a second power amplifier stage 110 (in this example, a final stage). The amplified RF output of the second amplifier stage 110 is coupled to an output IMN 112, the output of which is RFOUT at an impedance level matching following circuitry (not shown). The PA 100 example shown in FIG. 1 has two amplifier stages, but other embodiments may have fewer or more than two amplifier stages. One or more of the various IMN circuits 104, 108, 112 may be implemented in a tunable configuration, such as by using tunable inductors and/or tunable capacitors; some of the IMN circuits may be optional for some embodiments; in some embodiments, one or more of the IMN circuits may be off-chip circuits; and in some embodiments, one or more circuit functions may be split among multiple ICs.

A common need with current RF systems, such as cellular telephones and WiFi systems, is to monitor the forward power output by a power amplifier 100, for example, in order to regulate the amount of transmitted power. A common solution is to capacitively couple a power detector to the output of the output IMN 112. A problem with that solution is that reflected power, such as from an antenna, is also coupled into the power detector, causing the power detector to exhibit a sensitivity to the voltage standing wave ratio (VSWR) that exists at the output of the final amplifier stage 110 (VSWR is essentially the ratio of "reflected power" to "forward power"). Capacitively coupling a power detector before the final amplifier stage 110 avoids the problem of reflected power, but obviously does not really represent the output power of the final amplifier stage 110.

Accordingly, there is a need for detection of the actual output power of a power amplifier that is "VSWR insensitive", meaning that reflected power is essentially not coupled to the power detector and only forward power is detected and processed. The present invention meets this and other needs.

SUMMARY OF THE INVENTION

The present invention encompasses an ultra-compact coupler designed to sample the actual output power of a power amplifier and which is "VSWR insensitive", such that reflected power is essentially not coupled to a detector circuit and only forward power is detected and processed.

In a first embodiment, a coupler is situated between the final amplifier stage of a power amplifier and an output impedance matching network, and is specially configured for operation in a low impedance environment in conjunction with a detector circuit, thereby substantially reducing the areal size of the coupler.

In a second embodiment, a coupler is integrated within an output impedance matching network coupled to the final amplifier stage of a power amplifier so as to share an inductor between the coupler and the output impedance matching network, thereby further substantially reducing the areal size of the coupler.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 4A is a perspective diagram of a directional coupler architecture formed by spaced-apart stacked inductive coils Lc1 and Lc2.

FIG. 4B is a top plan view of an integrated circuit layout of a directional coupler architecture having vertically spaced inductors.

FIG. 4C is a top plan view of an integrated circuit layout of a directional coupler architecture having horizontally spaced inductors.

FIG. 10 is a process flow chart showing a method for implementing a coupler-based circuit configured to be coupled to the output of a final amplifier stage having a first output impedance and providing radio frequency forward power.

Like reference numbers and designations in the various drawings indicate like elements.

DETAILED DESCRIPTION OF THE INVENTION

The present invention encompasses an ultra-compact coupler designed to sample the actual output power of a power amplifier and which is "VSWR insensitive", such that reflected power is essentially not coupled to a detector circuit connected to a Coupled port and only forward power is detected and processed. In a first embodiment, a coupler is situated between the final amplifier stage of a power amplifier and an output impedance matching network, and is specially configured for operation in a low impedance environment in conjunction with a detector circuit, thereby substantially reducing the areal size of the coupler. In a second embodiment, a coupler is integrated within an output impedance matching network coupled to the final amplifier stage of a power amplifier, thereby further substantially reducing the areal size of the coupler.

Directional Couplers

Various embodiments of the present invention utilize a specially configured directional coupler. A conventional directional coupler is a passive electronic device often used in radio and telecommunications systems that allows a defined amount of the power in a radio frequency (RF) signal flowing from an input port to an output port of a signal line to be electromagnetically coupled to a coupled port. An essential feature of directional couplers is that they only couple power flowing in one direction (i.e., they are unidirectional). A directional coupler may be implemented with two inductors in close enough proximity so that energy from one inductor passes to the other inductor via inductive and capacitive coupling. As is known in the art, most directional couplers have four ports:

(1) an Input port, where power is applied (e.g., an RF signal in the "forward" direction);
(2) a Coupled port, where an electromagnetically coupled portion of the power applied to the Input port appears; current is both inductively and capacitively added at the Coupled port;
(3) an Output (or Direct) port, where the power from the Input Port is output, less the portion of the power that went to the Coupled port; and
(4) an Isolated port, where inductively coupled current and capacitively coupled current from the signal applied at the Input Port essentially cancel each other; this port is therefore essentially isolated with respect to a signal entering at the "forward" direction Input port (note that, in the case of a reflected signal entering the Output port, such a "reverse" direction signal also will be coupled to the Isolated port and thus be isolated from the Coupled port because of the same signal cancellation properties of the coupler architecture).

Figure 2:
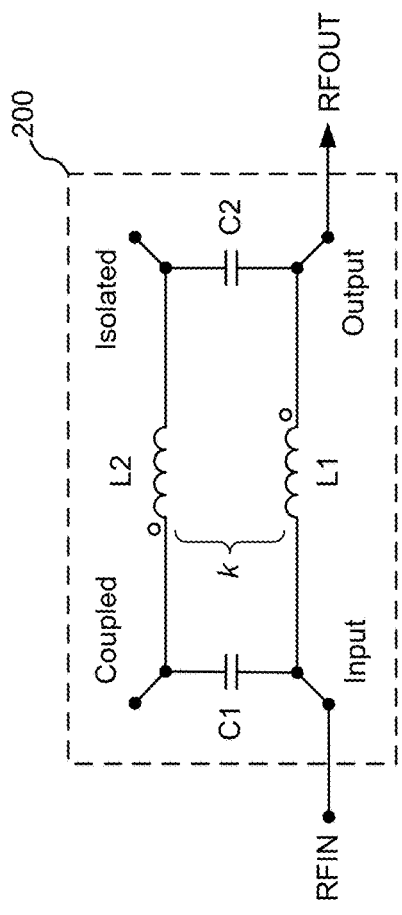
FIG. 2 is a schematic diagram of a simple equivalent circuit of a prior art directional coupler.

FIG. 2 is a schematic diagram 200 of a simple equivalent circuit of a prior art directional coupler 200. The inductive coupling of such a coupler may be modeled as parallel inductors L1, L2, while the capacitive coupling of such a coupler may be modeled as parallel capacitors C1, C2. A mutual coupling factor k exists between both inductors L1, L2, and the small circle symbol next to each inductor L1, L2 represents the corresponding polarity. Not shown are optional capacitances, resistances and/or inductances that may be added to the circuit for tuning or adjustment purposes. Also not shown are parasitic capacitances (e.g., between the coupled inductors and a ground plane) and/or resistances and/or inductances that may be coupled to each port.

Low Impedance Coupling Configuration

Figure 1:
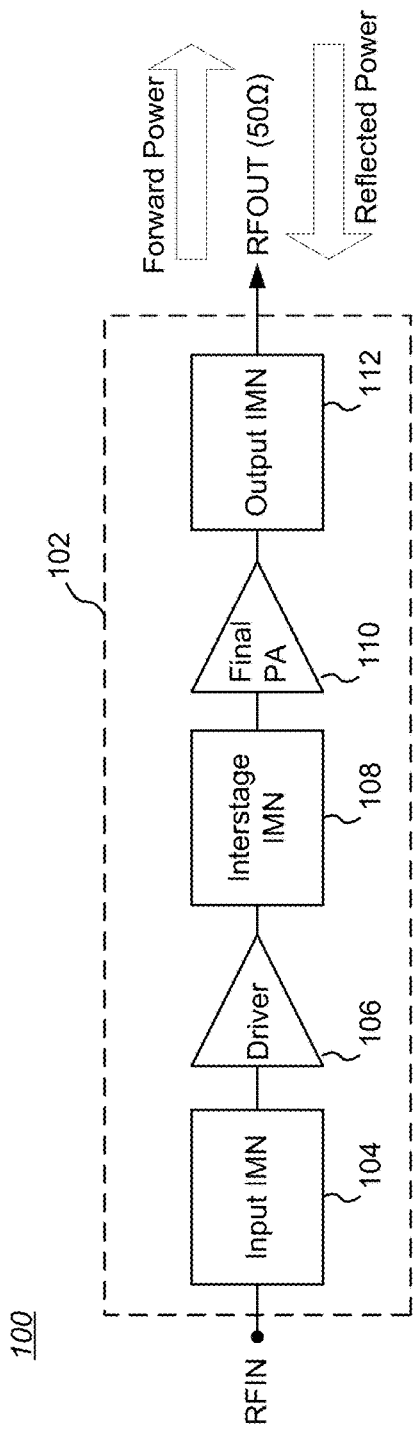
FIG. 1 is a block diagram of a prior art radio transmitter two-stage power amplifier.
Figure 3A:
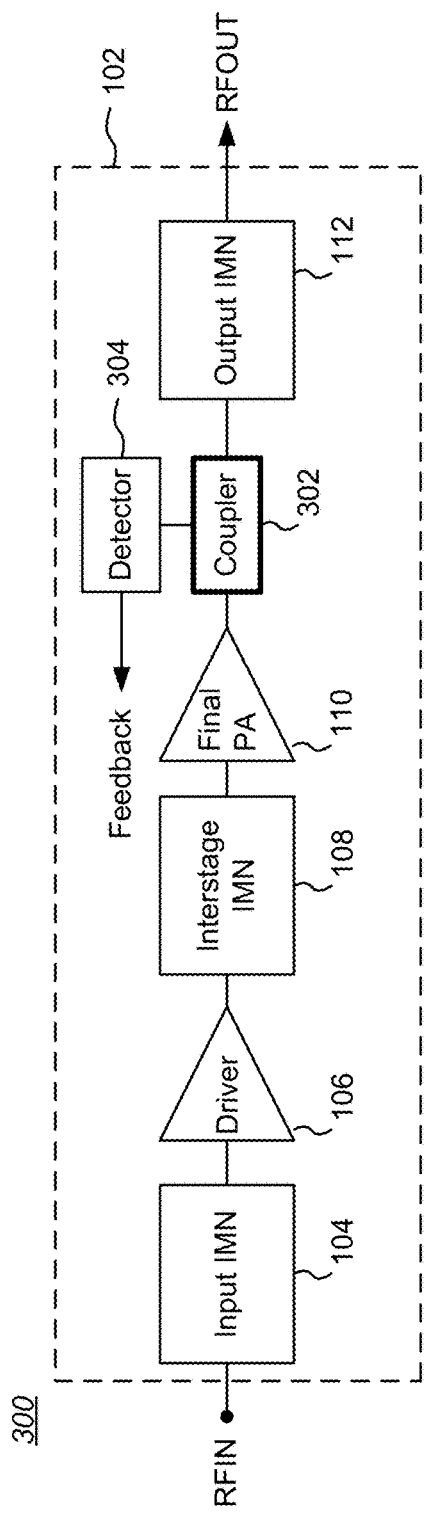
FIG. 3A is a block diagram of an example radio transmitter power amplifier that includes an embodiment of the present invention suitable for a low impedance environment.

FIG. 3A is a block diagram of an example radio transmitter power amplifier 300 that includes an embodiment of the present invention suitable for a low impedance environment. The power amplifier 300 is similar to the circuit configuration shown in FIG. 1, but includes a coupler 302 situated between the final amplifier stage 110 and the output impedance matching network (IMN) 112. In turn, a detector circuit 304 is connected to the coupler 302. The detector circuit 304 may be, for example, a power detector circuit, but may also provide other or additional detection functions, such as detection of frequency, voltage, current, signal envelope, etc. The detector circuit 304 may generally be configured to provide a Feedback signal to other circuitry, as described in greater detail below, but may be configured to provide a measurement output to other circuitry (e.g., for a display of power level). The detector circuit 304 may be integrated with the coupler 302 on the same IC, or may be on a separate IC.

Figure 3B:
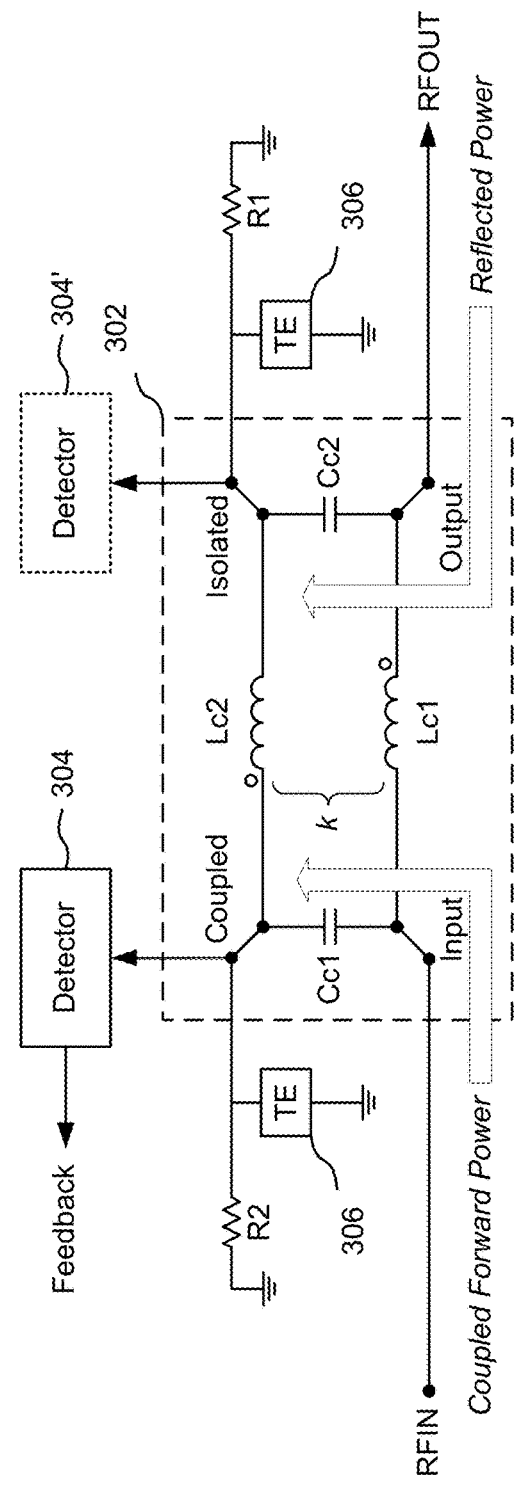
FIG. 3B is a schematic diagram of a simple equivalent circuit of one embodiment of the coupler shown in FIG. 3A.

FIG. 3B is a schematic diagram of a simple equivalent circuit of one embodiment of the coupler 302 shown in FIG. 3A. In this example, the coupler 302 is a directional coupler modeled with parallel inductors Lc1, Lc2 coupled between parallel capacitors Cc1, Cc2. A mutual coupling factor k exists between both inductors, and the small circle symbol next to each inductor Lc1, Lc2 represents the corresponding polarity. The coupler 302 is also configured with the Isolated port connected to circuit ground through a first terminating impedance, such as resistor R1, and the Coupled port connected to circuit ground through a second terminating impedance, such as resistor R2. An input of the detector circuit 304 is connected to the Coupled port of the coupler 302 in the illustrated embodiment. Optionally, a detector circuit 304' may be connected to the Isolated port of the coupler 302. Such a configuration may be useful, for example, for detecting characteristics (such as power) of a reflected "reverse" direction signal. Similarly, additional detector circuits (not shown) may be connected to the Input port and/or the Output port, such as a configuration that enables detection of peak signal voltage characteristics for comparison to a detected signal characteristic at one or more other ports of the coupler 302. Note that coupled detector circuits, as well as other coupled circuits, may contribute to the terminating load impedances, thus supplementing R1 and/or R2, or replacing R1 and/or R2 if sufficiently large.

Optionally, other termination elements 306 may be coupled to the Coupled port and/or the Isolated port. The termination elements 306 may be, for example, a simple capacitor or a capacitor in parallel with a resistor, but may be more complex circuits that include passive RL, RC, LC, or RLC elements, with or without active circuit components (e.g., shunt and/or bypass switches). The termination elements 306 generally are used to enhance coupler performance and/or matching to connecting circuits. The termination elements 306 may differ in architecture and component value for each port, and need not be designed components in some applications. For example, in some embodiments, the termination elements 306 may be implemented (at least in part) as parasitic capacitances, such as a ground plane that provides sufficient parasitic capacitance with respect to the conductive structures that form the inductors Lc1, Lc2. In any case, designed capacitors in an IC embodiment can be realized using conventional inter-layer dielectric (ILD) or metal-insulator-metal (MIM) technologies. Other capacitances, resistances, and/or inductances may be added to the circuit for tuning or adjustment purposes. Not shown are parasitic capacitances and/or resistances and/or inductances that may be coupled to each port.

To provide tunability, such as in a termination element 306, any designed capacitor can be a digitally tunable capacitor (DTC), such as is taught in U.S. Pat. No. 6,667,506, issued on Dec. 23, 2003, entitled "Variable Capacitor with Programmability"; U.S. Pat. No. 9,024,700, issued on May 5, 2015, entitled "Method and Apparatus for use in Digitally Tuning a Capacitor in an Integrated Circuit Device"; or U.S. Pat. No. 9,197,194, issued on Nov. 24, 2015, entitled "Methods and Apparatuses for Use in Tuning Reactance in a Circuit Device", all assigned to the assignee of the present invention and hereby incorporated by reference.

The set of inductors Lc1, Lc2 of the coupler 302 may be implemented in a number of ways. For example, FIG. 4A is a perspective diagram 400 of a directional coupler architecture formed by spaced-apart stacked inductive coils Lc1 and Lc2. The inductive coils Lc1, Lc2 correspond to the inductive elements Lc1, Lc2 shown schematically in FIG. 3B, while the capacitance between the spaced-apart inductive coils Lc1, Lc2 corresponds to the capacitive elements Cc1, Cc2 shown schematically in FIG. 3B. The inductive coils Lc1, Lc2 may be formed on an integrated circuit (IC) as conductive signal paths, in known fashion (e.g., a spiral inductor set using multiple metallic layers). In the illustrated example, the inductive coils Lc1, Lc2 are vertically spaced by a distance h, which may be accomplished by interposing an insulating layer between the conductive signal paths during the IC fabrication process. The inductive coils Lc1, Lc2 are generally concentric and have a small value for h, but the coils also may have some horizontal offset d to accommodate fabrication constraints or to achieve a specified degree of coupling. Using stacked inductive coils Lc1, Lc2 is particularly useful in complementary metal oxide semiconductor (CMOS) ICs fabricated on high-Q substrates, such as silicon-on-insulator (SOI) substrates, which include silicon-on-sapphire (SOS) substrates. However, external (off-chip) inductive elements Lc1, Lc2 may also be used in some applications.

As additional examples, FIG. 4B is a top plan view of an integrated circuit layout of a directional coupler architecture having vertically spaced inductors, and FIG. 4C is a top plan view of an integrated circuit layout of a directional coupler architecture having horizontally spaced inductors. In both examples, a coil inductor Lc1 is formed in conventional fashion. As is known in the art, while the main body of the coil inductor Lc1 commonly would be fabricated in substantially the same plane, a cross-over segment 402 may be fabricated in another plane (e.g., a metal layer overpass above or underpass below the plane of the main coil body) and electrically connected (e.g., by vertical vias) so as to provide an accessible circuit connection to the inner end of the coil inductor Lc1. In the illustrated examples, a second inductor Lc2 is fabricated as a conductive strip in close enough proximity to the coil inductor Lc1 so that energy passes between the strip inductor Lc2 and the coil inductor Lc1 via inductive and capacitive coupling. In FIG. 4B, the strip inductor Lc2 is fabricated in a plane spaced over or under the plane of the coil inductor Lc1 by a vertical offset h (e.g., an inductor set fabricated using multiple metallic layers). In FIG. 4C, the strip inductor Lc2 is fabricated in the same plane as the main body of the coil inductor Lc1, but spaced apart from the coil inductor Lc1 (e.g., adjacent an edge) by some horizontal offset d (e.g., an inductor set fabricated using a single metallic layer). A combination of vertical offset h and horizontal offset d also may be used with either of the configurations shown in FIGS. 4B and 4C.

While a generally square-shaped spiral structure is shown for at least one inductor coil of FIGS. 4A-4C, the general shape of each coil inductor may be, for example, circular, octagonal, hexagonal, or other suitable geometric form, and may be irregular. Accordingly, there is a good deal of design flexibility in physical layout of such coils. Further, while the coupled inductor (Lc2) is shown in FIGS. 4B and 4C as a strip inductor, other shapes may be used, including a coil inductor. Moreover, a strip inductor need not be simply fabricated as a straight line, by may have some meandering or convolution to it, such as a wave-like "zig zag" or sine-like structure.

Referring to FIG. 3B, in operation, a small portion of the forward power from the final amplifier stage 110 is inductively and capacitively coupled through the Lc1, Lc2 inductor set to the Coupled port, and hence also coupled to the detector circuit 304. Reflected power is similarly inductively and capacitively coupled and arrives at the Isolated port, where such power is dissipated in the terminating resistor R1.

An important aspect of positioning the coupler 302 between the final amplifier stage 110 and the output IMN 112 comes from the realization that the impedance after the output IMN 112 has a characteristic value (typically about 50 ohms for a modern RF system) that is substantially greater than the impedance after the final amplifier stage 110 (typically about 5 ohms for a modern power amplifier). By designing the coupler 302 to operate at the lower impedance, the size of the Lc1, Lc2 inductor set can be substantially reduced; to a first order approximation, the size reduction is proportional to the impedance ratio (e.g., 5/50). For example, a typical directional coupler positioned after the output IMN 112 uses an inductor set having values exceeding 1 nH at about 2.4 GHz, which requires a large amount of IC area dedicated to the inductor set. However, by positioning the coupler 302 between the final amplifier stage 110 and the output IMN 112, inductor values can be used that are "sub nH", ranging from about 0.1 nH to about 0.5 nH at about 2.4 GHz, with a mutual coupling factor k ranging from about 0.1 to about 1.0 between the inductors. The resulting inductor set requires comparatively little IC area while maintaining directivity.

More generally, the architecture of the invention allows fabrication of couplers with a reactance ranging from about 0 ohms to about 100 ohms (i.e., orders of magnitude 0 to 2). Such couplers are considered to be "electrically small" (a commonly used term for antennas that are much smaller than wavelength, which is the case here too), or, alternatively, to have a "fractional" wavelength.

Utilizing readily available fabrication processes, the mutual coupling factor k can be designed by adjusting the distance (h and/or d) between the Lc1, Lc2 inductor set elements (such as the sets shown in FIGS. 4A-4C), changing the geometry of the Lc1, Lc2 inductor set elements, and/or by changing the dielectric material separating the Lc1, Lc2 inductor set elements. Notably, the small component values for the coupler 302 can be realized with little or no significant impact on power amplifier performance.

Shared Component Coupling Configuration

The low impedance coupler configuration described with respect to FIG. 3B requires adding two coupled inductors (Lc1, Lc2) to the circuit of FIG. 3A. While situating the inductors on the low impedance node between the final amplifier stage 110 and the output IMN 112 allows the use of an ultra-compact, low reactance inductor set, additional areal savings can be achieved by integrating a coupler within the output IMN 112 such that inductor elements are shared between the coupler and the output IMN 112.

Figure 5A:
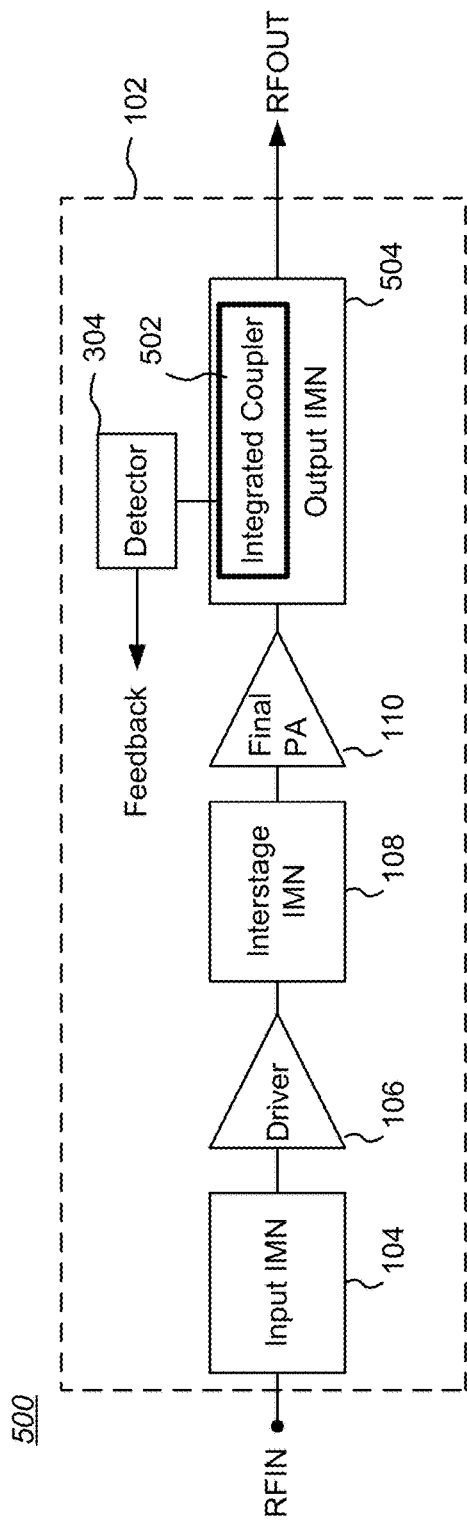
FIG. 5A is a block diagram of an example radio transmitter power amplifier that includes an embodiment of the present invention having a shared component coupler configuration.

FIG. 5A is a block diagram of an example radio transmitter power amplifier 500 that includes an embodiment of the present invention having a shared component coupler configuration. The power amplifier 500 is similar to the circuit configuration shown in FIG. 1, but includes a coupler 502 integrated within an output IMN 504. In turn, a detector circuit 304 is connected to the coupler 502; optionally, a detector circuit 304' may also be connected to the Isolated port of the coupler 302. As in the example of FIGS. 3A and 3B, each detector circuit 304, 304' may be, for example, a power detector circuit, but may also provide other or additional detection functions, such as detection of frequency, voltage, current, signal envelope, etc. Each detector circuit 304, 304' may generally be configured to provide a Feedback signal to other circuitry, as described in greater detail below, but may be configured to provide a measurement output to other circuitry (e.g., for a display of power level). Each detector circuit 304, 304' may be integrated with the coupler 502 on the same IC, or may be on a separate IC.

Figure 5B:
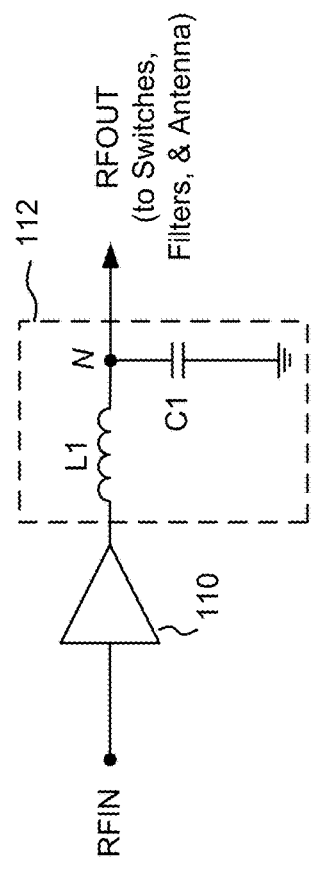
FIG. 5B is a schematic diagram of a typical output IMN (i.e., not having an integrated coupler, as in FIG. 5A).

FIG. 5B is a schematic diagram of a typical output IMN 506 (i.e., not having an integrated coupler, as in FIG. 5A). The illustrated output IMN 506 is simply an LC network comprising an inductor L1 series-connected at one end to the output of a final amplifier stage 110, and a capacitor C1 shunt-connected between the other end of the inductor L1 and circuit ground. The impedance of the RF input to L1 from the final amplifier stage 110 is transformed by L1 and C1 to match the impedance of further circuitry (not shown) coupled to the node N between L1 and C1. Note that the basic two-element (i.e., L1 and C1) narrowband output IMN 506 shown in FIG. 5B is used for simplicity. Embodiments of the invention may be used with impedance matching networks having a greater number of reactive elements (i.e., inductors and/or capacitors) for broadband impedance matching.

It was realized that the existence of L1 in the output IMN 506 could be utilized as part of a coupler circuit. More particularly, a segment of L1 in the output IMN 506 can be shared as one inductor of a coupler inductor set, thus providing an IC areal savings over a design that requires two dedicated inductors for a coupler inductor set.

Figure 5C:
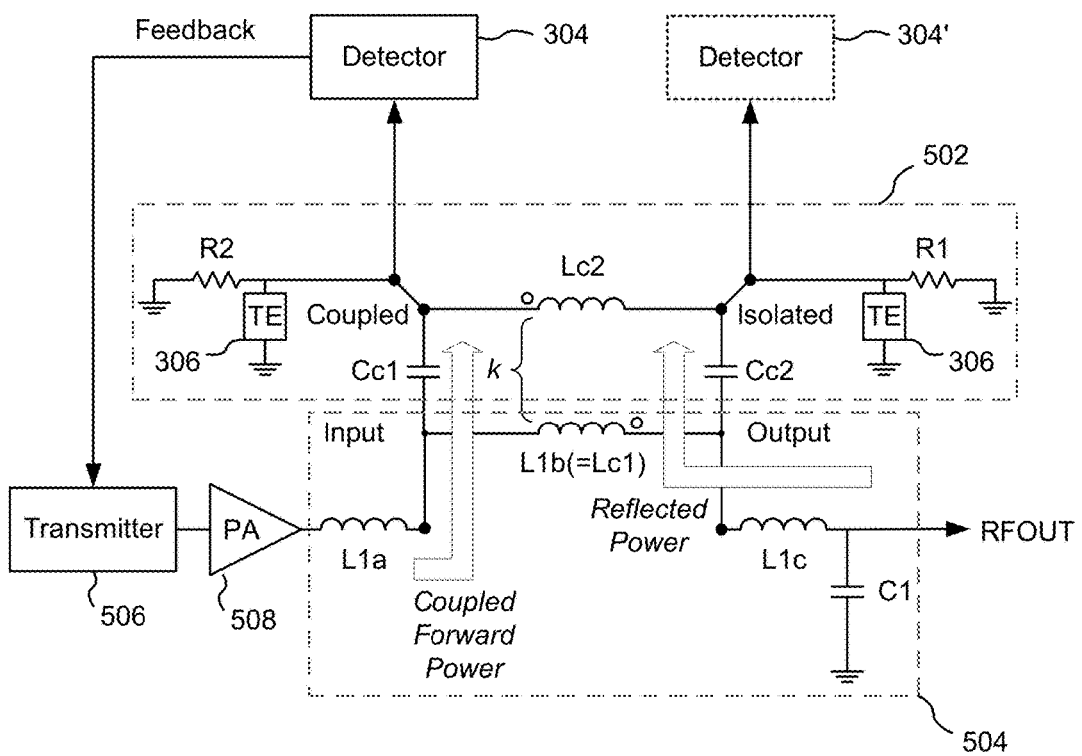
FIG. 5C is a schematic diagram of a simple equivalent circuit of one embodiment of the integrated coupler shown in FIG. 5A.

FIG. 5C is a schematic diagram of a simple equivalent circuit of one embodiment of the integrated coupler 502 shown in FIG. 5A. In this example, the coupler 502 is a directional coupler modeled with parallel inductors Lc1, Lc2 coupled between parallel capacitors Cc1, Cc2. A mutual coupling factor k exists between both inductors, and the small circle symbol next to each inductor Lc1, Lc2 represents the corresponding polarity. The coupler 502 is also configured with the Isolated port connected to circuit ground through a first terminating resistor R1, and the Coupled port connected to circuit ground through a second terminating resistor R2. Optionally, termination elements 306 may be coupled to the Coupled port and/or the Isolated port, as described above with respect to FIG. 3B.

The input of a detector circuit 304 is connected to the Coupled port of the coupler 502. A Feedback signal output by the detector circuit 304 is coupled in this example to a transmitter 506, the output of which is coupled to a final amplifier stage 508 (generally through intermediate circuitry, which has been omitted for clarity).

The output of the final amplifier stage 508 is coupled to an output IMN 504 of the type shown in FIG. 5B, with the exception that the inductor L1 of FIG. 5B is shown subdivided into series-connected segments L1$a$, L1$b$(=Lc1), and L1$c$. Thus, while the integrated coupler 502 and part of the output IMN 506 of FIG. 5C appear quite similar schematically to the coupler 302 of FIG. 3B, the L1$b$(=Lc1) inductor segment of the output IMN 506 is electrically shared between the output IMN 504 and the integrated coupler 502.

Figure 5D:
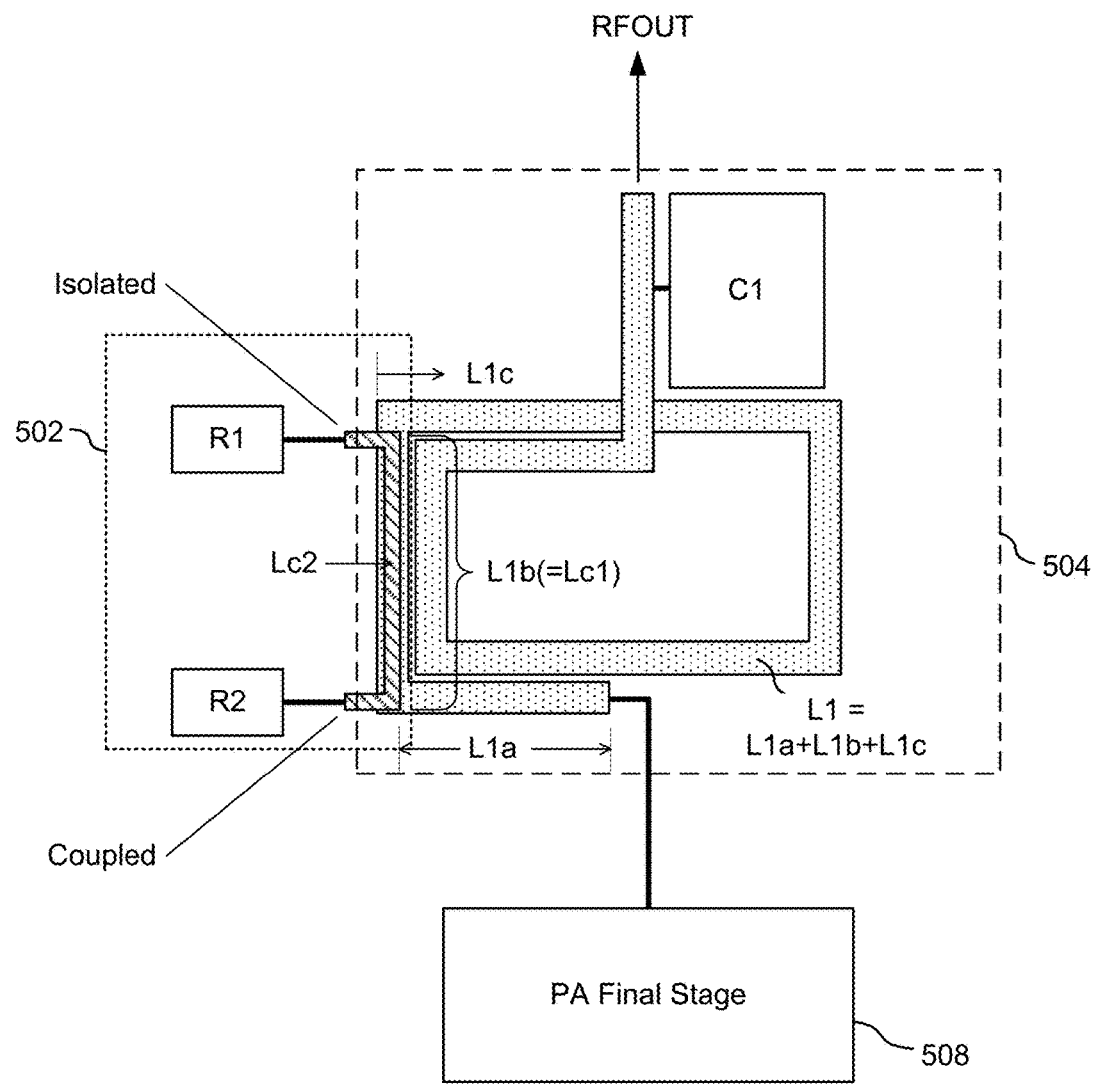
FIG. 5D is a stylized top plan view of an example integrated circuit layout showing the overlap of the integrated coupler and the output IMN of FIG. 5C.

FIG. 5D is a stylized top plan view of an example integrated circuit layout showing the overlap of the integrated coupler 502 and the output IMN 506 of FIG. 5C. An inductor coil L1 would be a necessary part of the LC circuit of the output IMN 504. In this example, L1 comprises an input inductor segment L1$a$, a coupling inductor segment L1$b$(=Lc1), and an output inductor segment L1$c$; thus, L1=[L1$a$+L1$b$(=Lc1)+L1$c$].

Overlaying the L1$b$(=Lc1) coupling inductor segment of L1, in spaced-apart relation, is the Lc2 inductor (e.g., a metallic line) of the integrated coupler 502. In this example, the Isolated port of the integrated coupler 502 is coupled to a terminating resistor R1, and the Coupled port is coupled to a terminating resistor R2. In this example, the detector circuit 304 has been omitted.

As illustrated, the L1 inductor and the Lc2 inductor are similar to the vertically-spaced coupler configuration shown in FIG. 4B; however, the horizontally-spaced coupler configuration shown in FIG. 4C (or a hybrid vertically and horizontally spaced configuration) may also be used. Furthermore, the Lc2 inductor may be implemented as a second coil, similar to the stacked coil coupler configuration shown in FIG. 4A. Moreover, in some applications, both the L1 inductor of the output IMN 506 and the Lc2 inductor of the integrated coupler 502 may be strip inductors (with Lc2 generally being much shorter than L1).

The layout of FIG. 5D is flexible in design. For example, the positioning of the Lc2 inductor of the integrated coupler 502 relative to the coupling inductor segment L1$b$(=Lc1) shared with the output IMN 506 is a matter of design choice (noting that the coupling of Lc2 with L1 defines which part of the L1 inductor is considered to be the coupling inductor segment L1$b$). As a further design degree of freedom, the closer that the coupling inductor segment L1$b$(=Lc1) is to the input from the final power amplifier stage 508, the lower the impedance seen by the integrated coupler 502. Moreover, the integrated coupler 502 need not be aligned with the coupling inductor segment of the L1 inductor; thus, if L1 was laid out differently, then Lc2 might be aligned with the input inductor segment L1$a$ or the output inductor segment L1$c$. Thus, the Input port of the integrated coupler 502 may be connected to the output of the final amplifier stage 508 (or, alternatively, to the input of the output IMN 506) directly or through the input segment of the L1 inductor; similarly, the Output port of the integrated coupler 502 may be coupled to the output of the output IMN 506 directly or through the output segment of the L1 inductor. As a further example of design freedom, multiple integrated couplers 502 may be juxtaposed to associated coupling inductor segments of the L1 inductor of the output IMN 506, or to associated coupling inductor segments of one or more inductors of an output IMN 506 that includes a complex, multi-inductor impedance matching network. A configuration of multiple integrated couplers 502 may be used to maximize reliability or to enable monitoring signal characteristics (e.g., power/voltage levels) at multiple points within a complex tuning circuit.

The space savings of the integrated circuit configuration of FIG. 5D should be quite apparent: since the Lc1 inductor of the inductor set for the integrated coupler 502 is simply a segment (L1b) of the existing L1 inductor of the output IMN 504, no additional area is needed for a second, dedicated Lc1 inductor. In one embodiment using an integrated coupler 502, the area of the integrated coupler 502 and terminating resistors R1, R2 was about 200 µm×20 µm in a selected CMOS fabrication technology. In comparison, a similarly performing non-integrated coupler made with the same CMOS fabrication technology but designed to be situated after the output IMN measured about 200 µm×200 µm, which is 10 times larger.

Performance Examples

Figure 6:
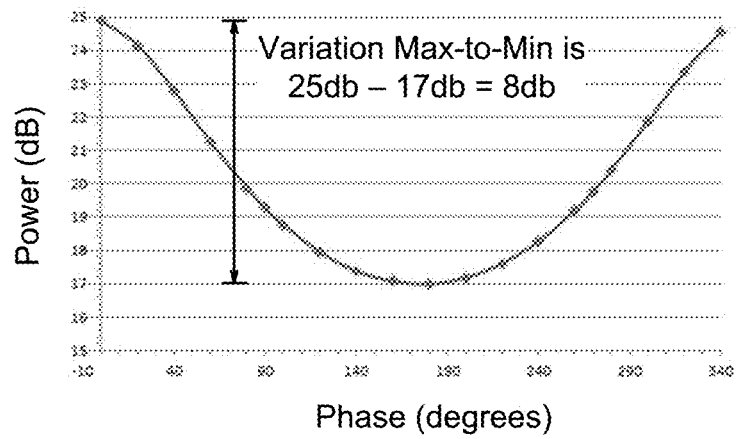
FIG. 6 is a graph of measured power Pout (in dB) versus phase angle (in degrees) measured at a detector circuit capacitively coupled to RFOUT after the output impedance matching network of an RF transmitter power amplifier.

FIG. 6 is a graph of measured power Pout (in dB) versus phase angle (in degrees) measured at a detector circuit 304 capacitively coupled to RFOUT after the output impedance matching network 112 of an RF transmitter power amplifier 100. With a VSWR ratio of 3:1, power at the detector circuit 304 varies by about 8 dB.

Figure 7:
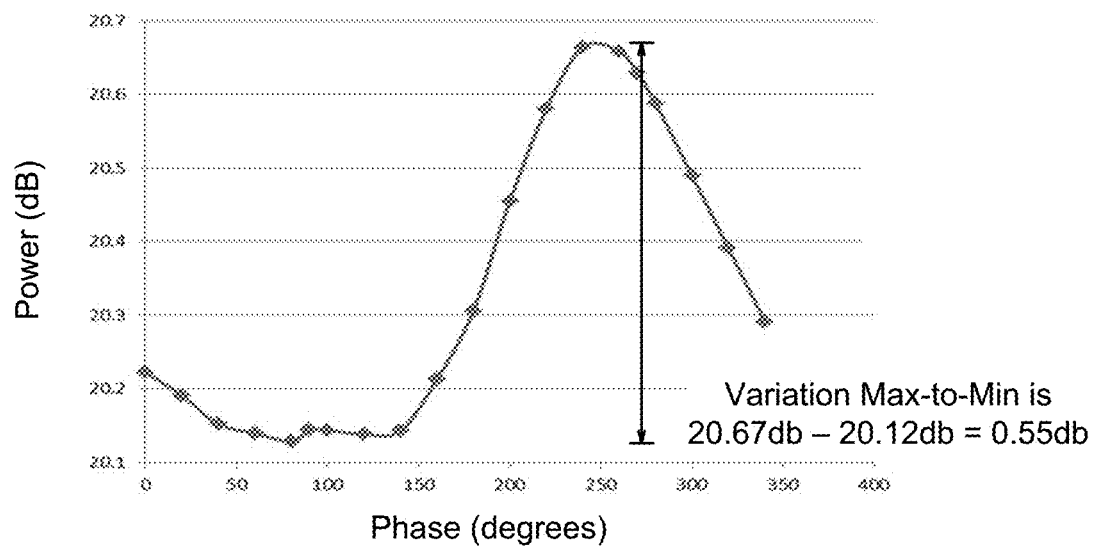
FIG. 7 is a graph of measured power Pout (in dB) versus phase angle (in degrees) measured at a detector circuit coupled to the Coupled port of a coupler integrated within the output impedance matching network of an RF transmitter power amplifier, as in FIG. 5C.

In contrast, FIG. 7 is a graph of measured power Pout (in dB) versus phase angle (in degrees) measured at a detector circuit 304 connected to the Coupled port of a coupler 502 integrated within the output impedance matching network 504 of an RF transmitter power amplifier 508, as in FIG. 5C. Again using a VSWR ratio of 3:1 (and noting the significant difference in vertical scales between FIG. 6 and FIG. 7), power at the detector circuit 304 varies only by about 0.6 dB-about 7.5% of the power variation of the example shown in FIG. 6.

Feedback Example

Referring again to FIG. 5C, in operation, the transmitter 506 outputs modulated RF power (RFIN or Pin) to the final amplifier stage 508, which amplifies the modulated signal and outputs Forward Power. While most of the Forward Power is applied to other circuits (e.g., filters, RF signal switches, and/or antennas) as RFOUT (or power delivered, Pout), Coupled Forward Power from the final amplifier stage 508 is separated out by the integrated coupler 502 (which also blocks and dissipates reflected power) and applied to input of the detector circuit 304.

As noted above, the detector circuit 304 may be, for example, a power detector circuit, such as a voltage mode power detector. However, the detector circuit 304 may also provide other or additional detection functions, such as detection of frequency, voltage, current, signal envelope, etc. In this example, the detector circuit 304 provides a Feedback signal to the transmitter 506. The transmitter 506 receives the Feedback signal and adjusts the power level of Pin for optimal performance. For example, if the amount of power output at RFOUT exceeds a specified amount (e.g., set by vendor design criteria or carrier rules or national regulations), then the Feedback signal can adjust Pin downward to reduce the power level of RFOUT. More generally, the relation of Pin versus Pout versus EVM (Error Vector Magnitude, a standard measure used to quantify the performance of a digital radio transmitter or receiver) is well characterized at a 50 ohm matched condition, so the Pin level can be used to control Pout and EVM level to optimize transmitter performance, such as in a WiFi system.

In one embodiment of an integrated coupler 502 designed for placement after a final amplifier stage 508 (~5 ohm impedance at output) and integrated within an output IMN 504 (~50 ohm impedance at output), the approximate circuit values for the output IMN 504 were C1=3.25 pF, and total L1=0.95 nH. The approximate circuit values for the integrated coupler 502 were Cc1=20 fF, Cc2=20 fF, Lc1(=L1b)=0.2 nH (and thus L1a+L1c=[0.95 nH-0.20 nH]=0.75 nH), Lc2=0.2 nH, and R2=125 ohms, with the mutual coupling factor k ranging from 0.1-0.5 and R1 ranging from 50-500 ohms (the selected value of R1 depending on the selected value of k). Notably, the small component values for the integrated coupler 502 can be realized with little or no significant impact on power amplifier performance.

Design Process

In light of the number of circuit parameters for the couplers shown in FIGS. 3B and 5C, it may be beneficial to select component values in a logical fashion. For many applications, a principal design goal for such couplers is to maximize its directivity by optimizing the coupler circuit component values, where directivity is the ("Coupled Forward Power at the Coupled port" divided by "Reflected Power at the Coupled port").

For example, referring to FIGS. 3B and 5C, the values of Cc1 and R2 are mainly responsible for the amount of Coupled Forward Power directed to the detector circuit 304 (typically less than about –20 dB, depending on the specification), so those values may be selected first. The value of the mutual coupling factor k, and the ratio of the resistances of the terminating impedances, resistors R1 and R2, play an important role in maximizing the directivity of the directional coupler 302, 502. One method for selecting those three values is to utilize a circuit simulation program to sweep through all the possible realizable values for k and R2/R1 (given the selected values for values for Cc1 and R2) and then choose the best results for a particular application. Selection of all other component values should encourage Reflected Power to be coupled to the Isolated port and dissipated in the terminating impedance, resistor R1, rather than through the Coupled port to the detector circuit 304. For the most accurate coupling level and VSWR performance, the coupler circuit 302, 502 should be co-simulated as part of the entire set of circuits comprising the transmitter power amplifier 300, 500.

Methods

Another aspect of the invention includes methods for implementing a radio frequency (RF) power amplifier circuit having a compact coupler, and methods for implementing a coupler-based circuit configured to be coupled to the output of a final amplifier stage.

Figure 8:
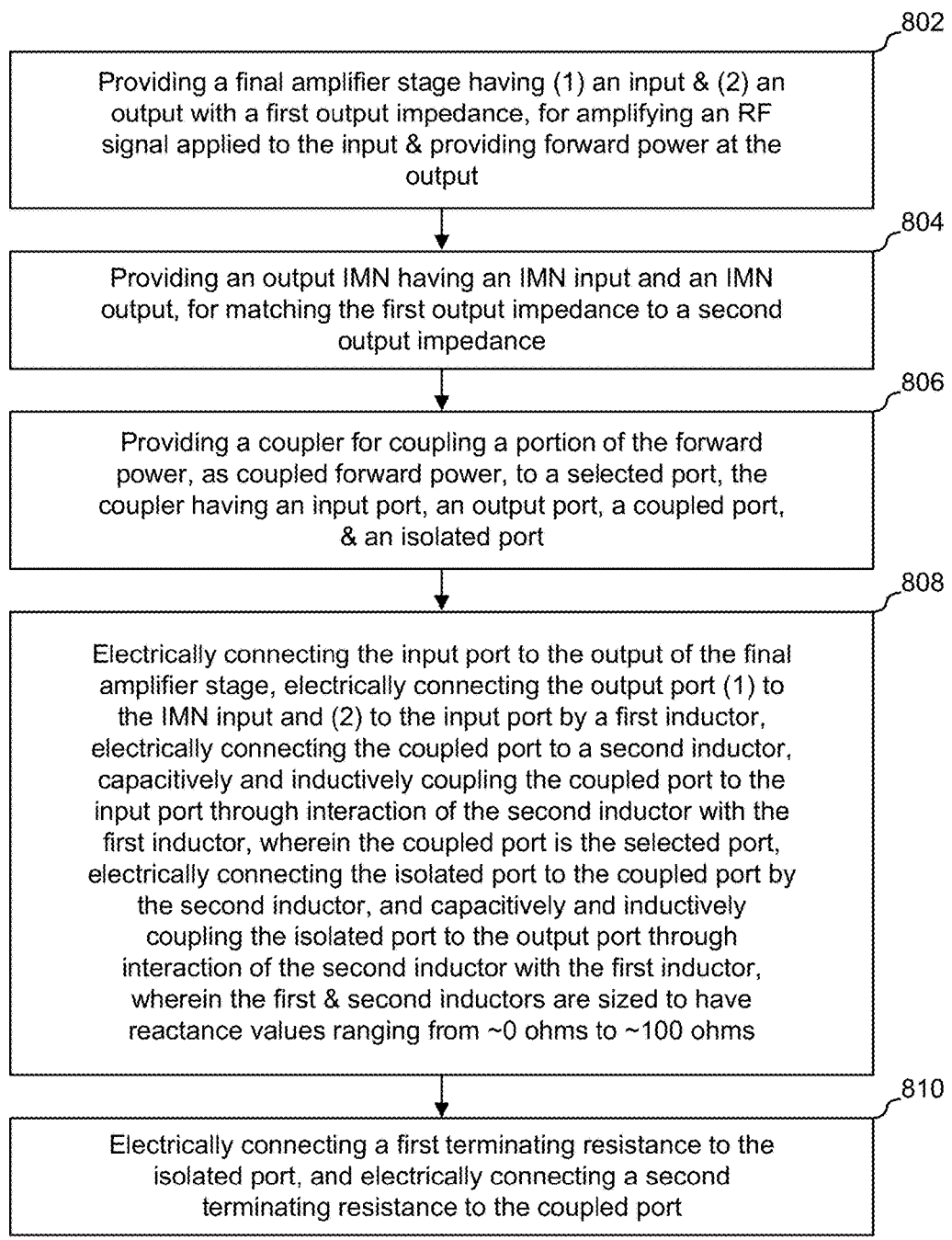
FIG. 8 is a process flow chart showing a first method for implementing an RF power amplifier circuit having a compact coupler.

FIG. 8 is a process flow chart 800 showing a first method for implementing an RF power amplifier circuit having a compact coupler. The method includes: providing a final amplifier stage having (1) an input and (2) an output with a first output impedance, for amplifying an RF signal applied to the input and providing forward power at the output (STEP 802); providing an output impedance matching network (IMN) having an IMN input and an IMN output, for matching the first output impedance to a second output impedance (STEP 804); providing a coupler for coupling a portion of the forward power, as coupled forward power, to a selected port, the coupler having an input port, an output port, a coupled port, and an isolated port (STEP 806); electrically connecting the input port of the coupler to the output of the final amplifier stage, electrically connecting the output port of the coupler (1) to the IMN input and (2) to the input port of the coupler by a first inductor, electrically connecting the coupled port of the coupler to a second inductor, and capacitively and inductively coupling the coupled port of the coupler to the input port of the coupler through interaction of the second inductor with the first inductor, wherein the coupled port of the coupler is the selected port, electrically connecting the isolated port of the coupler to the coupled port of the coupler by the second inductor, and capacitively and inductively coupling the isolated port of the coupler to the output port of the coupler through interaction of the second inductor with the first inductor, wherein the first and second inductors are sized to have reactance values ranging from about zero ohms to about 100 ohms (STEP 808); and electrically connecting a first terminating impedance to the isolated port of the coupler, and electrically connecting a second terminating impedance to the coupled port of the coupler (STEP 810).

Figure 9:
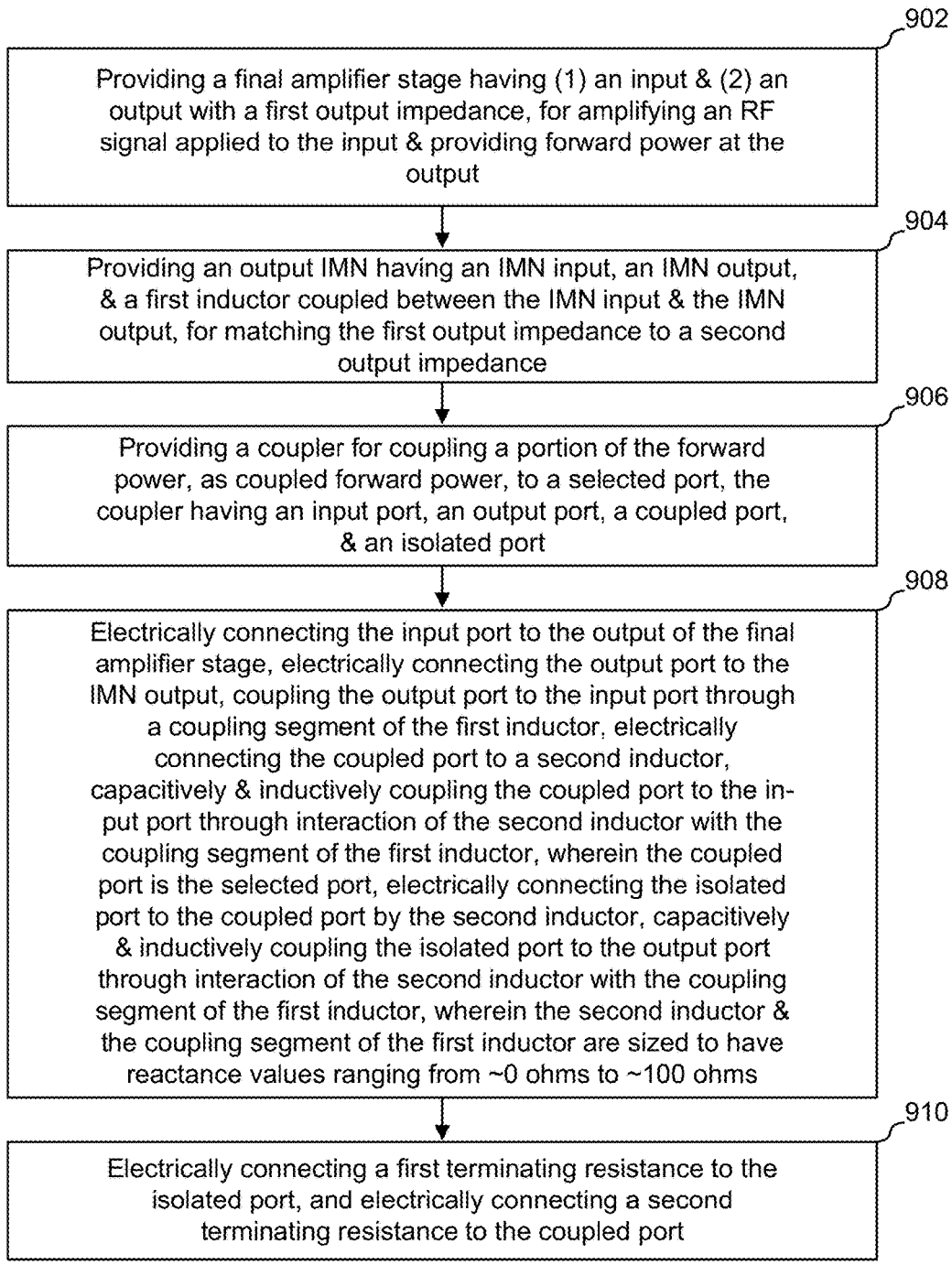
FIG. 9 is a process flow chart showing a second method for implementing an RF power amplifier circuit having a compact coupler.

FIG. 9 is a process flow chart 900 showing a second method for implementing an RF power amplifier circuit having a compact coupler. The method includes: providing a final amplifier stage having (1) an input and (2) an output with a first output impedance, for amplifying an RF signal applied to the input and providing forward power at the output (STEP 902); providing an output impedance matching network (IMN) having an IMN input, an IMN output, and a first inductor coupled between the IMN input and the IMN output, for matching the first output impedance to a second output impedance (STEP 904); providing a coupler for coupling a portion of the forward power, as coupled forward power, to a selected port, the coupler having an input port, an output port, a coupled port, and an isolated port (STEP 906); electrically connecting the input port of the coupler, directly or through an input segment of the first inductor, to the output of the final amplifier stage, electrically connecting the output port of the coupler, directly or through an output segment of the first inductor, to the IMN output, coupling the output port of the coupler to the input port of the coupler through a coupling segment of the first inductor, electrically connecting the coupled port of the coupler to a second inductor, and capacitively and inductively coupling the coupled port of the coupler to the input port of the coupler through interaction of the second inductor with the coupling segment of the first inductor, wherein the coupled port of the coupler is the selected port, electrically connecting the isolated port of the coupler to the coupled port of the coupler by the second inductor, capacitively and inductively coupling the isolated port of the coupler to the output port of the coupler through interaction of the second inductor with the coupling segment of the first inductor (STEP 908); and electrically connecting a first terminating impedance to the isolated port of the coupler, and electrically connecting a second terminating impedance to the coupled port of the coupler (STEP 910).

FIG. 10 is a process flow chart 1000 showing a method for implementing a coupler-based circuit configured to be coupled to the output of a final amplifier stage having a first output impedance and providing radio frequency forward power. The method includes: providing an output impedance matching network (IMN) having an IMN input, an IMN output, and a first inductor coupled between the IMN input and the IMN output, for matching the first output impedance to a second output impedance (STEP 1002); providing a coupler that provides a portion of the provided forward power, as coupled forward power, to a selected port, the coupler having an input port, an output port, a coupled port, and an isolated port (STEP 1004); electrically connecting the input port of the coupler, directly or through an input segment of the first inductor, to the IMN input, electrically connecting the output port of the coupler, directly or through an output segment of the first inductor, to the IMN output, coupling the output port of the coupler to the input port of the coupler through a coupling segment of the first inductor, electrically connecting the coupled port of the coupler to a second inductor, capacitively and inductively coupling the coupled port of the coupler to the input port of the coupler through interaction of the second inductor with the coupling segment of the first inductor, wherein the coupled port of the coupler is the selected port, electrically connecting the isolated port of the coupler to the coupled port of the coupler by the second inductor, and capacitively and inductively coupling the isolated port of the coupler to the output port of the coupler through interaction of the second inductor with the coupling segment of the first inductor (STEP 1006); and electrically connecting a first terminating impedance to the isolated port of the coupler, and electrically connecting a second terminating impedance to the coupled port of the coupler (STEP 1008).

The methods above may include one or more of the following: the second inductor and the coupling segment of the first inductor being sized to have reactance values ranging from about zero ohms to about 100 ohms; the first and second inductor being sized to have reactance values ranging from about zero ohms to about 100 ohms; the first and second inductors being sized to have values ranging from about 0.1 nH to about 0.5 nH; at least one of the first and second inductor being a coiled inductor; at least one of the first and second inductor being a strip inductor; fabricating the final amplifier stage, the coupler, and the output IMN on one integrated circuit; electrically connecting at least one detector circuit to the coupled port of the coupler; configuring at least one connected detector circuit to detect at least one of RF power, frequency, voltage, current, or signal envelope; configuring at least one connected detector circuit to output a feedback signal for controlling another circuit; configuring at least one connected detector circuit to output a feedback signal for controlling a radio frequency circuit, including at least the power level of the RF signal applied to the input of the final amplifier stage; fabricating the coupler and the output IMN on one integrated circuit; and/or fabricating the coupler, the output IMN, and the at least one detector circuit on one integrated circuit.

Options and Fabrication Technologies

While FIGS. 3B and 5C depict usage of a directional coupler 302, 502, a bi-directional coupler may also be used in some applications where the Reflected Power is to be sampled or measured. Examples of a bi-directional coupler are disclosed in U.S. patent application Ser. No. 15/594,336, filed May 12, 2017, entitled "Compact Low Loss Signal Coupler", reference above. Such examples may be adapted to operate in a low impedance environment (including shared inductor integration with an output IMN) by utilizing the principles of the present disclosure.

While the examples above have depicted a power amplifier as the source of an RF signal, embodiments of the invention may be used with other signal sources, and generally may be configured to be coupled between a first impedance and a second impedance.

In addition, multi-purposing of one or more inductors within a more extensive impedance matching network can be done while still meeting the spirit and scope of what has been depicted in the above examples.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS processes enables circuits with low power consumption, the ability to withstand high power signals during operation due to FET stacking, good linearity, and high frequency operation (i.e., radio frequencies up to and exceeding 50 GHz)). Monolithic IC implementation is particularly useful since parasitic capacitances generally can be kept low (or at a minimum, kept uniform across all units, permitting them to be compensated) by careful design. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A radio frequency (RF) power amplifier circuit including:
    (a) a final amplifier stage having (1) an input and (2) an output with a first output impedance, for amplifying an RF signal applied to the input and providing forward power at the output;
    (b) an output impedance matching network (IMN) having an IMN input, an IMN output, for matching the first output impedance to a second output impedance;
    (c) at least one coupler situated between the final amplifier stage and the output IMN, for coupling a portion of the forward power, as coupled forward power, to a selected port, each coupler including:
        (1) an input port electrically connected to the output of the final amplifier stage;
        (2) an output port electrically connected to the IMN input;
        (3) a first inductor electrically connected between the input port and the output port, the first inductor including a coupling segment that is shorter than the first inductor;
        (4) a coupled port electrically connected to a second inductor, and capacitively and inductively coupled to the input port through interaction of the second inductor with the coupling segment of the first inductor, wherein the coupled port is the selected port;
        (5) an isolated port electrically connected to the coupled port by the second inductor, and capacitively and inductively coupled to the output port through interaction of the second inductor with the coupling segment of the first inductor;
        (6) a first terminating impedance coupled to the isolated port; and
        (7) a second terminating impedance coupled to the coupled port;
    wherein the first inductor is electrically shared with the output IMN, the second inductor is shorter than the first inductor and defines the length of the coupling segment of the first inductor, and the first output impedance has a characteristic value that is substantially less than the characteristic value of the second output impedance.

2. The invention of claim 1, wherein the second inductor and the coupling segment of the first inductor are sized to have reactance values ranging from about zero ohms to about 100 ohms.

3. The invention of claim 1, wherein the first and second inductors are sized to have values ranging from about 0.1 nH to about 0.5 nH.

4. The invention of claim 1, wherein at least one of the first and second inductor is a coiled inductor.

5. The invention of claim 1, wherein at least one of the first and second inductor is a strip inductor.

6. The invention of claim 1, wherein the final amplifier stage, at least one coupler, and the output IMN are fabricated on one integrated circuit.

7. The invention of claim 1, further including at least one detector circuit each electrically connected to a corresponding one of the multiple ports of the coupler.

8. A coupler-based circuit configured to be coupled to a radio frequency circuit having a first output impedance and providing radio frequency forward power, the coupler-based circuit including:
    (a) an output impedance matching network (IMN) having an IMN input and an IMN output, for matching the first output impedance to a second output impedance; and
    (b) at least one coupler configured to be situated between the radio frequency circuit and the output IMN, for coupling a portion of the forward power, as coupled forward power, to a selected port, each coupler including:
        (1) an input port configured to be coupled to the radio frequency circuit;
        (2) an output port electrically connected to the IMN input;
        (3) a first inductor electrically connected between the input port and the output port, the first inductor including a coupling segment that is shorter than the first inductor;
        (4) a coupled port electrically connected to a second inductor, and capacitively and inductively coupled to the input port through interaction of the second inductor with the coupling segment of the first inductor, wherein the coupled port is the selected port;

(5) an isolated port electrically connected to the coupled port by the second inductor, and capacitively and inductively coupled to the output port through interaction of the second inductor with the coupling segment of the first inductor, (6) a first terminating impedance coupled to the isolated port; and (7) a second terminating impedance coupled to the coupled port;

wherein the first inductor is electrically shared with the output IMN, the second inductor is shorter than the first inductor and defines the length of the coupling segment of the first inductor, and the first output impedance has a characteristic value that is substantially less than the characteristic value of the second output impedance.

9. The invention of claim 8, wherein, for each coupler, the first and second inductor are sized to have reactance values ranging from about zero ohms to about 100 ohms.

10. The invention of claim 8, wherein the first and second inductors are sized to have values ranging from about 0.1 nH to about 0.5 nH.

11. The invention of claim 8, wherein at least one of the first and second inductor is a coiled inductor.

12. The invention of claim 8, wherein at least one of the first and second inductor is a strip inductor.

13. The invention of claim 8, wherein at least one coupler and the output IMN are fabricated on one integrated circuit.

14. The invention of claim 8, further including at least one detector circuit electrically connected to a corresponding one of the multiple ports of at least one coupler.

* * * * *